US006937848B2

(12) United States Patent
Eloranta et al.

(10) Patent No.: US 6,937,848 B2
(45) Date of Patent: *Aug. 30, 2005

(54) METHOD AND DEVICE FOR DIGITAL-TO-RF CONVERSION

(75) Inventors: Petri Eloranta, Espoo (FI); Pauli Seppinen, Espoo (FI); Julius Koskela, Helsinki (FI)

(73) Assignee: Nokia Corporation, Espoo (FI)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 113 days.

(21) Appl. No.: 10/717,986

(22) Filed: Nov. 20, 2003

(65) Prior Publication Data

US 2005/0113043 A1 May 26, 2005

(51) Int. Cl.[7] .......................... H04Q 11/12; H04B 1/04; H04L 27/36
(52) U.S. Cl. .................... 455/118; 455/127.1; 375/298; 327/113
(58) Field of Search .......................... 455/42, 118, 119, 455/127.1, 127.2, 326, 333; 375/295, 296, 302; 327/100, 112, 355, 356, 357

(56) References Cited

U.S. PATENT DOCUMENTS

| 4,088,905 A | * | 5/1978 | Comer ........................ 327/100 |
| 5,448,772 A | * | 9/1995 | Grandfield ................... 455/333 |
| 6,545,516 B2 | * | 4/2003 | Ylamurto et al. ........... 327/113 |

FOREIGN PATENT DOCUMENTS

WO   WO 02/37667   5/2002

OTHER PUBLICATIONS

IEEE Journal of Solid–State Circuits 0018–9200/02, vol. 37, No. 9; Gutierrez–Aitken et al.; "Ultrahigh–Speed Direct Digital Synthesizer Using InP DHBT Technology"; pp. 1115–1119; Sep. 2002.
IEEE 2001 Custom Integrated Circuits Conference 0/7803/6591–7/01; Splett et al.; "Solutions for highly integrated future generation software radio basestation transceivers"; pp. 511–518; 2001.
IEEE 0–7803–3625–9/96; Koli et al.; "Current–Mode Up–Converting D/A–Interface for Mobile Communication Transmitter Applications"; pp. 20–24; 1996.
IEEE 0018–9200/03; Zhou et al.; "A 10-Bit Wide–Band CMOS Direct Digital RF Amplitude Modulator"; pp. 1182–1188; 2003.

* cited by examiner

*Primary Examiner*—Quochien B. Vuong
(74) *Attorney, Agent, or Firm*—Ware, Fressola, Van Der Sluys & Aldolphson LLP

(57) ABSTRACT

A digital to RF-conversion device that combines the D/A conversion function and the upconversion function by a RF-carrier or IF-signal. The device comprises a plurality of parallel unit cells, each of which is a mixer cell type converter having a differential data switch section connected in series to a differential LO-switch pair. The differential LO-switch is further connected in series to a current source. Each unit cell is adapted to receive a control voltage indicative of a data signal value.

5 Claims, 6 Drawing Sheets

US 6,937,848 B2

METHOD AND DEVICE FOR DIGITAL-TO-RF CONVERSION

FIELD OF THE INVENTION

The present invention relates generally to a digital-to-analog converter and, more particularly, to a digital-to-analog converter for use in RF signal generation.

BACKGROUND OF THE INVENTION

In radio communication applications the designs are continuously aiming for simpler and cheaper radio architectures to increase integration level of the mobile terminals. Conventionally, a direct conversion transmitter has at least an I/Q modulator, an RF mixer, a filter and a power amplifier. The I/Q modulator is an efficient way to generate phase-modulated signals. It relies on two orthogonal signals, I and Q, to produce a signal complex waveform. In a direct conversion the I/Q modulator transforms the frequency spectrum of each orthogonal input signal to the RF carrier frequency. As such, two digital-to-analog (D/A) converters are needed to transform a digital baseband into an analog baseband, as shown in FIG. 1.

A conventional current-steering D/A-converter comprises a plurality of parallel unit cells divided into two or more sub-blocks, as shown in FIG. 2. In the figure, the converter is presented in a typical segmented configuration, wherein the current in the LSB (least-significant bit) cells is generated with parallel binary weighted units whereas the MSB (most-significant bit) sub-block has a set of unary coded cells. The number of the unary coded cells is $(2^m-1)$, where m is the number of bits in the MSB sub-block. Thus, the current for the first bit in the MSB sub-block is generated in one unary coded cell, the current for the second bit in the MSB sub-block is generated in two unary coded cells, and the current for the m bit is generated in $2^{m-1}$ cells. The D/A converter has two current paths for conveying differential currents $I_{out}$ and $I_{xout}$ so that the analog signal output $V_{out}$ can be formed with two external load resistors (not shown).

Typically, each of the parallel unit cells comprises a differential switch pair connected in series to a cascode current source, as shown in FIG. 3. The differential switch pair has two current control paths Q1 and Q2, connected to the output terminals $V_o$ and $V_{xo}$ of the D/A converter. The currents in these paths are controlled by complementary signals $V_{LN+}$ and $V_{LN-}$, which are provided by a digital control logic and are indicative of the value of signal N. The cascode current source has two transistors Q3 and Q4 so as to allow the currents in the cell to be adjusted by DC bias4.

The D/A converters and I/Q modulators are complex and high performance analog elements. The requirement of these analog elements generally limits the flexibility of the RF transmitter.

Ideally a digital radio transmitter is independent of the radio standard and can be used in all of the modulation schemes and signal frequencies. In practice, this requires a D/A converter that is capable of operating at least twice the maximum radio frequency of the used standard. One of the major problems associated with D/A converters for use in RF generation is the high sampling frequency. If an RF signal of 1.8 GHz is generated, the sampling rate in the digital baseband must be at least 3.6 GHz. Furthermore, in order to effectively filter the mirror image component around the frequency difference between the sampling frequency and the digital signal frequency, a much higher sampling rate is needed. A D/A converter with such a high sampling frequency is impractical to implement because of the high price and high power consumption. For that reason, D/A converters are typically used in the baseband or in the low IF range. These converters are used along with high performance analog mixers for RF generation. These I/Q mixers consume easily tens of milliamperes of DC currents. Moreover, even when the D/A converters are used in the baseband and in the IF range, the noise current spikes occur because of the high data rate of hundreds of megahertz. These noise spikes can limit the performance of the RF transmitter.

It is thus advantageous and desirable to provide a cost-effective method and device for carrying out digital-to-analog conversion associated with RF generation. At the same time, the power consumption is reduced.

Yuan (EP1338085) discloses a direct digital amplitude modulator wherein an upconverting type of converter cell is used. In Yuan, a number of sub-switched current source units are switched on or off according to the combinations of the digital input signal and the delayed or non-delayed clock signals to produce or to cancel quantized RF, IF or DC currents and/or voltages at the time precisely controlled by the delayed clock signals. As such, the performance of the circuit is low due to a slow settling of the current in the current source after switching the current source on.

It is advantageous and desirable to provide a method and device for direct digital amplitude modulation wherein the cutting off of the current flow is avoided.

SUMMARY OF THE INVENTION

According to the first aspect of the present invention, there is provided a digital to RF-conversion device for converting a digital signal having a plurality of data bits for providing a differential output signal modulated by a carrier signal, the carrier signal provided between two carrier signal ends, wherein the differential output signal is formed with current loads and provided between two output ends. The device comprises:

a plurality of conversion units connected in parallel, each unit adapted to receive a control voltage indicative of a data signal value, the control voltage provided between two control voltage ends, each unit comprising:

a first differential switch section having:

two input current paths, each operatively connected to a different one of the output ends; and two differential switch pairs connected to the control voltage ends for conveying in the two input current paths differential currents indicative of the data signal value;

a second differential switch section having two control current paths, each operatively connected in series to a different one of the two differential switch pairs, the control current paths operatively and separately connected to different ones of the carrier signal ends, for modulating the differential currents with the carrier signal; and a current source, operatively connected in series to the second differential switch section for further controlling currents in the control current paths.

According to the present invention, the current source comprises at least one current adjusting component having a control terminal, operatively connected to a bias voltage level, for adjusting the current passing through the current adjusting component.

According to the present invention, the second differential switch section comprises two current switching components disposed in different ones of the control current paths, each of the current switching components having a control terminal operatively connected to a different one of the carrier signal ends; and the first differential switch section comprises a first pair of differential switches and a second pair of differential switches, each pair having two current switches operatively connected to different ones of the control voltage ends.

According to the second aspect of the present invention, there is provided a method for direct digital to RF-conversion for converting a digital signal having a plurality of data bits for providing a differential output signal modulated by a carrier signal, the carrier signal provided between two carrier signal ends, wherein the differential output signal is formed with current loads and provided between two output ends. The method comprises the steps of:

1) providing a plurality of conversion units connected in a parallel, each unit adapted to receive a control voltage indicative of a data signal value, the control voltage provided between two control voltage ends, each unit comprising:

a first differential switch section having:

two input current paths, each operatively connected to a different one of the output ends; and two differential switch pairs connected to the control voltage ends for conveying in the two input current paths differential currents indicative of the data signal value; and a second differential switch section having two control current paths, each of which operatively connected in series to a different one of the two differential switch pairs;

2) operatively and separately connecting the control current paths to different ones of the carrier signal ends, for modulating the differential currents with the carrier signal; and 3) operatively connecting a current source in series to the second differential switch section for further controlling currents in the control current paths.

The invention will become apparent upon reading the description taken in conjunction with FIGS. 4 to 7.

BEST MODE FOR CARRYING OUT THE INVENTION

Figure 1:
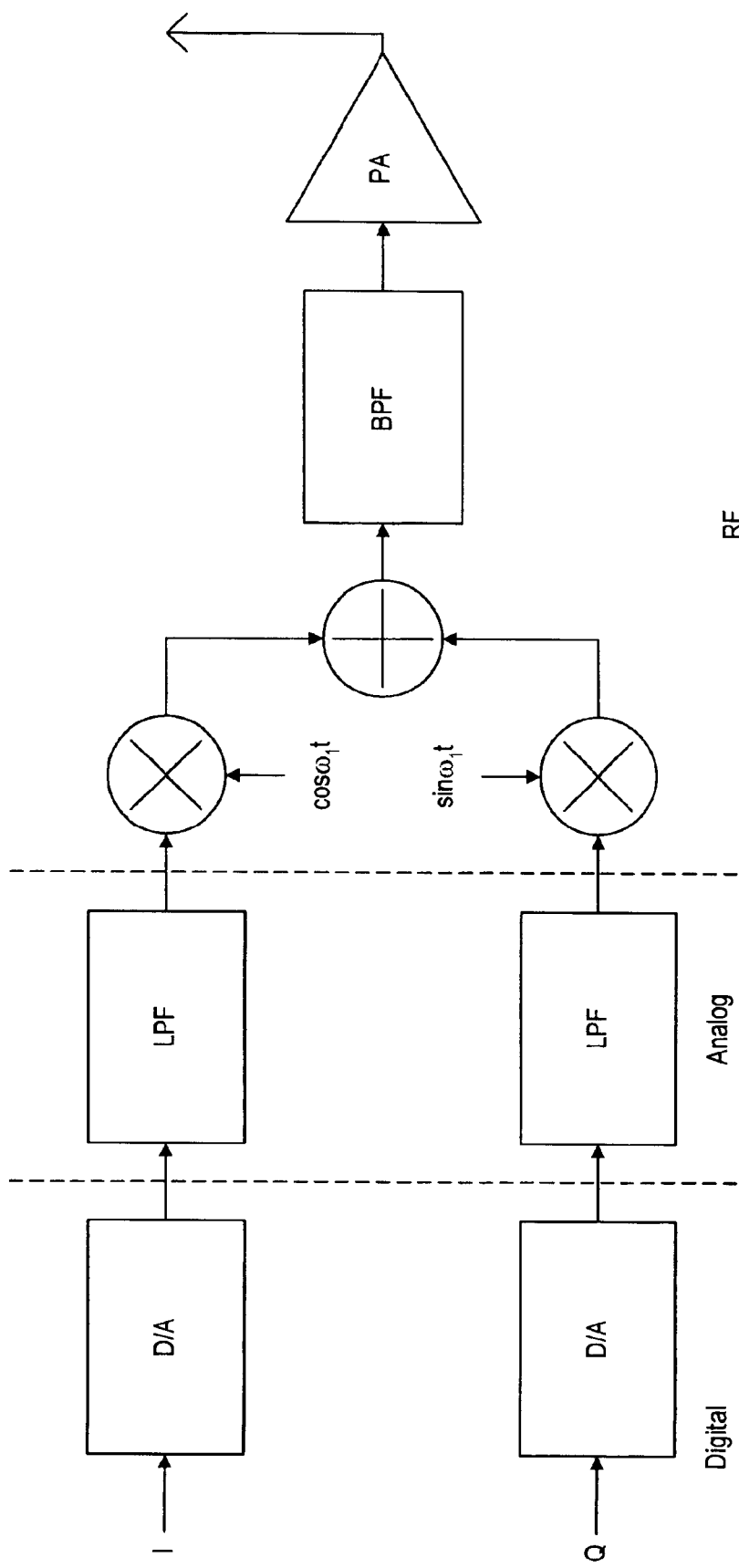
FIG. 1 is a block diagram showing a traditional direct conversion transmitter.
Figure 2:
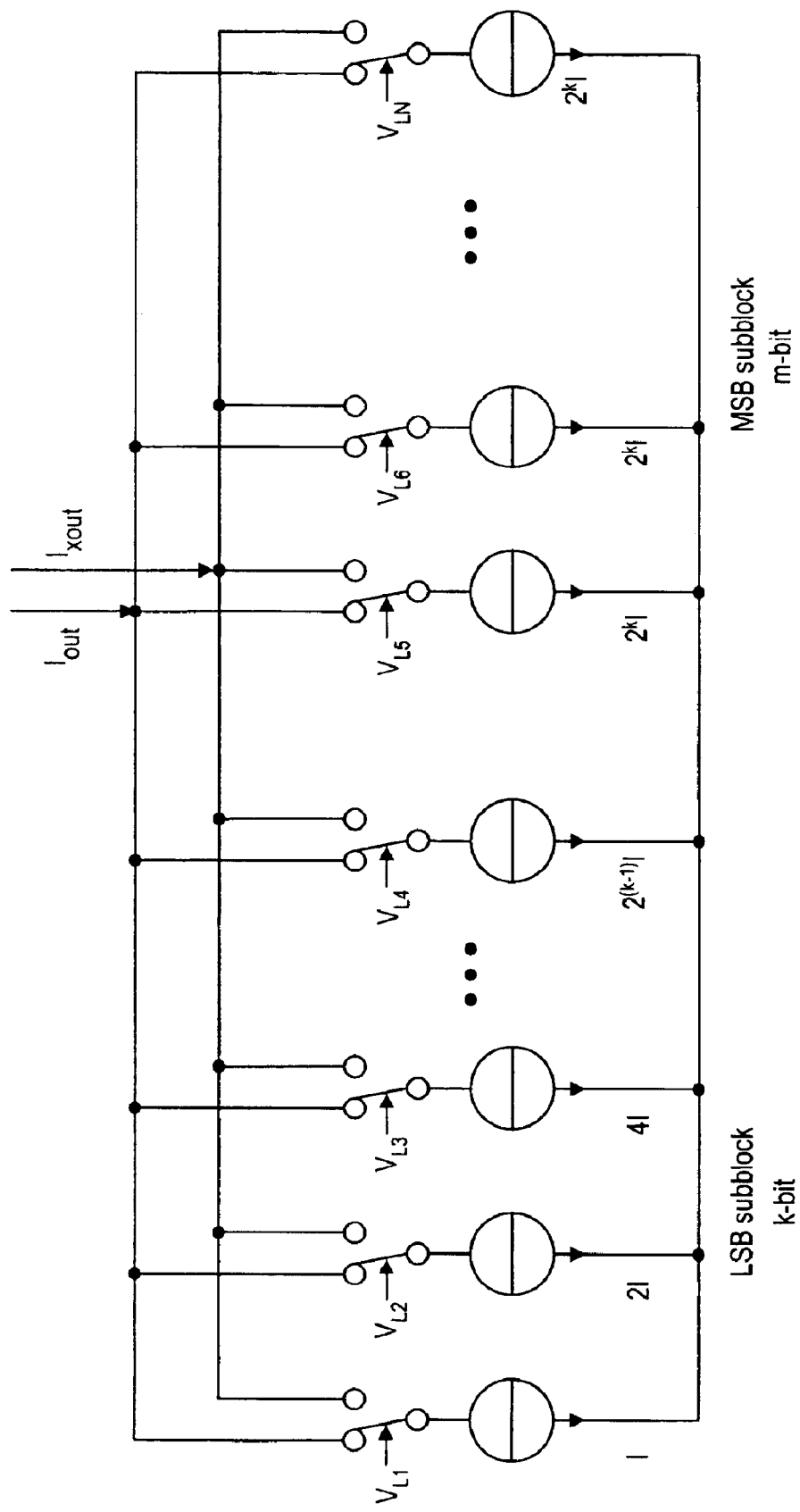
FIG. 2 is a schematic representation illustrating a prior art D/A converter.
Figure 3:
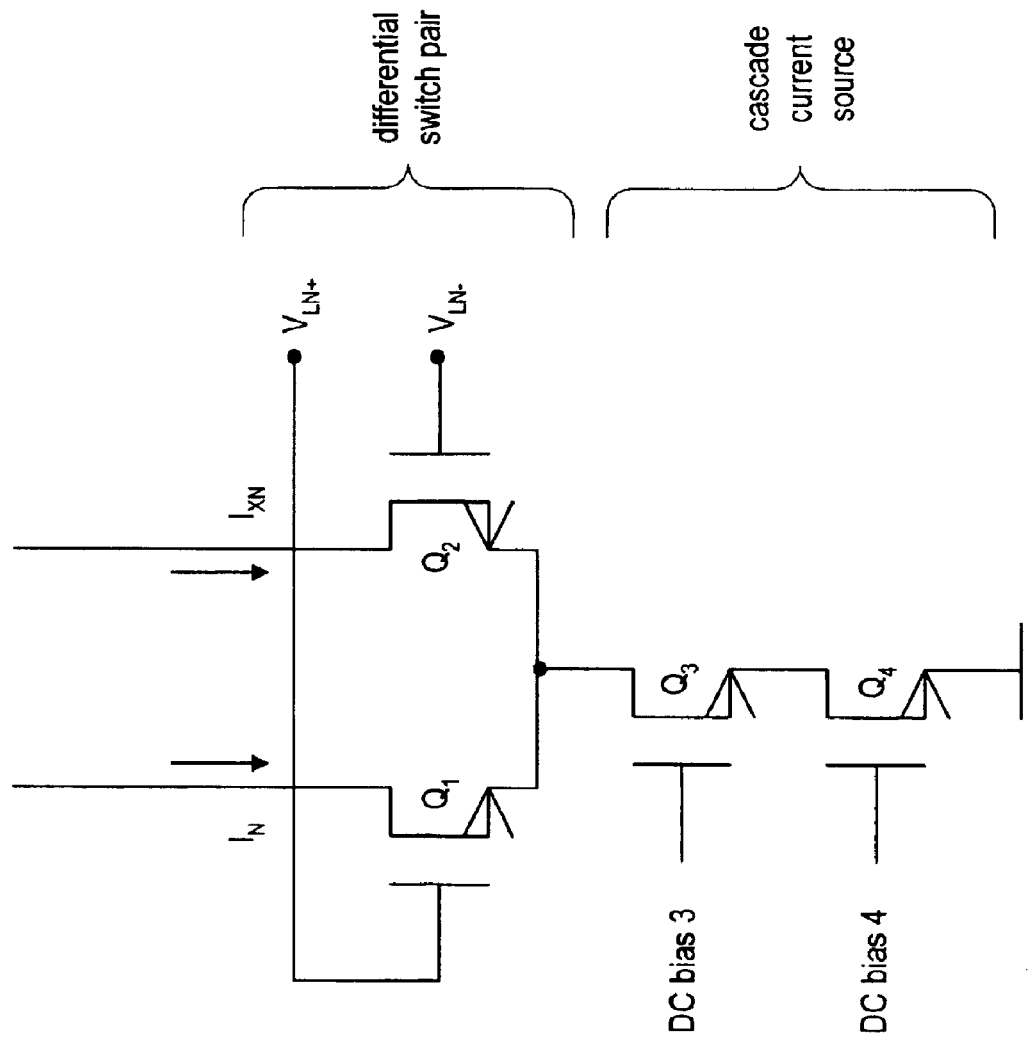
FIG. 3 is a circuitry showing a parallel unit cell in a prior art D/A converter.
Figure 4:
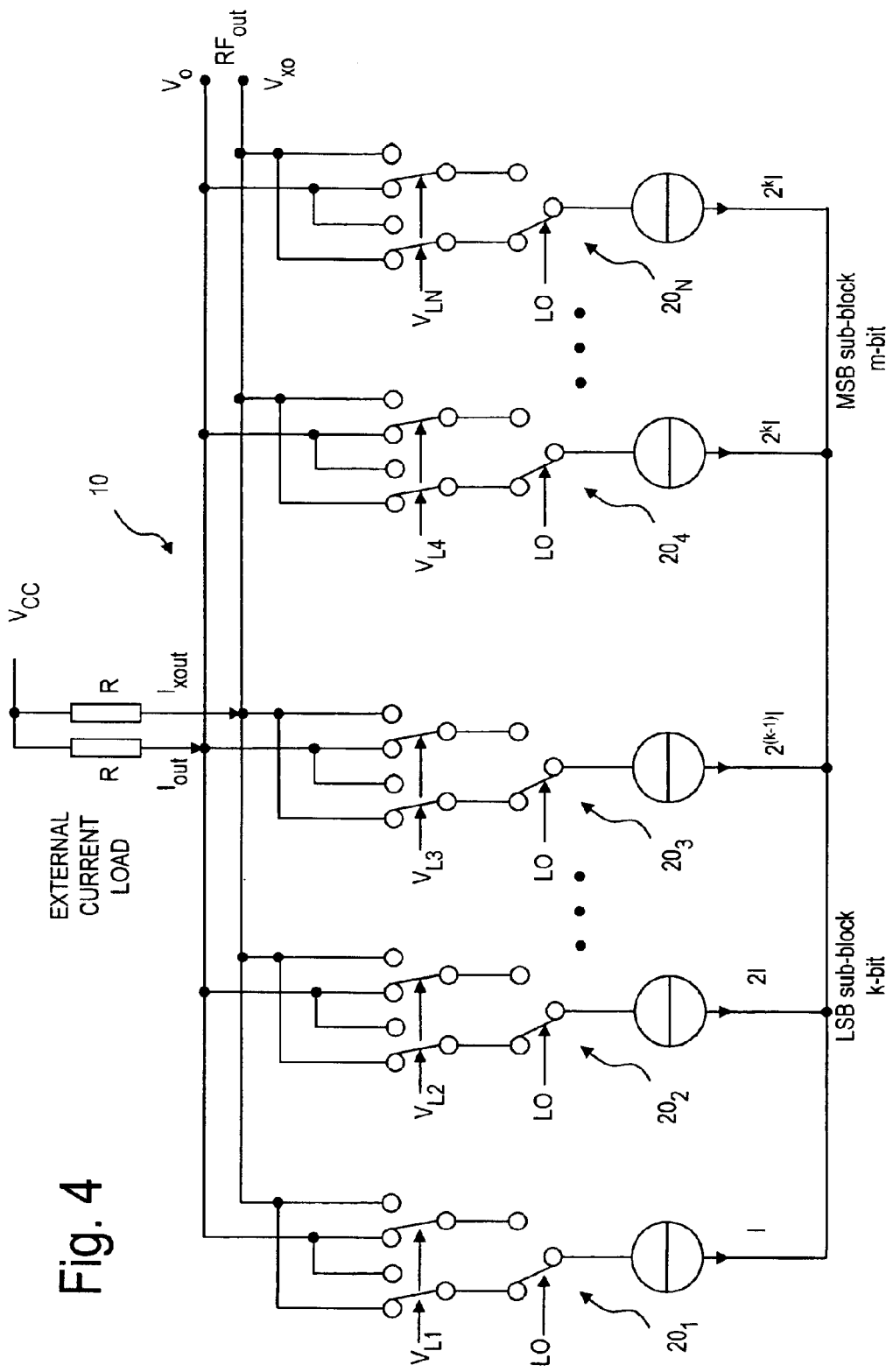
FIG. 4 is a schematic representation illustrating a Digital-to-RF-converter, according to the present invention.

The Digital-to-RF-converter, according to the present invention, combines the D/A conversion function and the upconversion function by a carrier (LO), which can be RF or IF. As shown in FIG. 4, the Digital-to-RF-converter 10 comprises a plurality of parallel unit cells $20_1$, $20_2$, . . . , $20_N$, . . . . The upconverter 10 has a segmented configuration, including an LSB sub-block and an MSB sub-block. The current in the LSB sub-block is generated with parallel binary weighted units, whereas the current in the MSB sub-block is generated in a set of unary coded cells. The unary coding can be also used in the LSB sub-block. As with the convention D/A converter shown in FIG. 1, the number of the unary coded cells in the MSB sub-block in the Digital-to-RF-converter 10 is also $2^m-1$, where m is the number of bits in MSB sub-block. The Digital-to-RF-converter 10 has two differential current paths for conveying differential currents $I_{out}$ and $I_{xout}$, so that the modulated output signal, $RF_{out}$, can be formed with two external load resistors, R. The modulated output signal is provided at two terminals $V_o$ and $V_{xo}$. The upconversion is carried out by applying a carrier signal (LO) from a local oscillator to each of the parallel unit cells 20.

Figure 5:
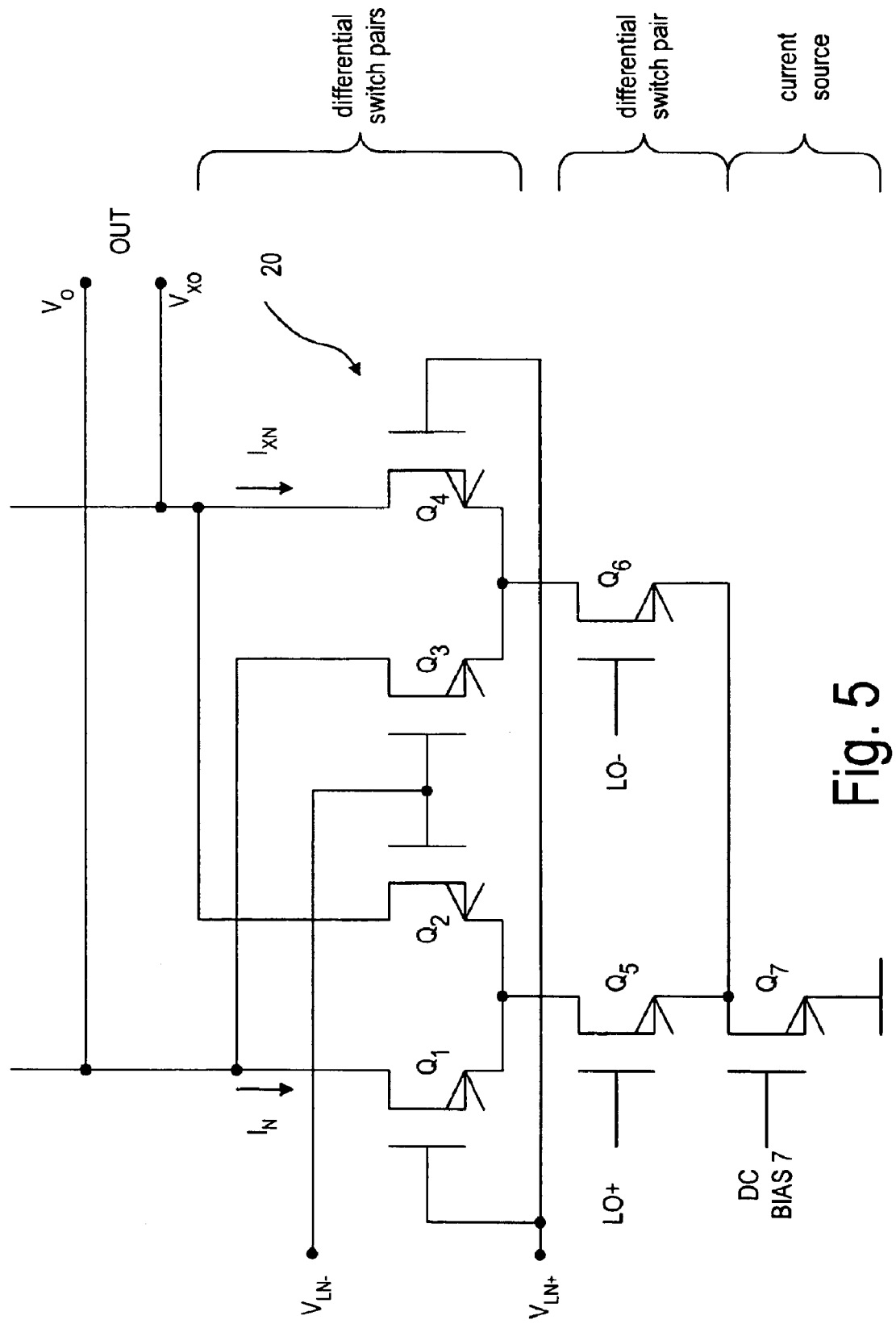
FIG. 5 is a circuitry showing a parallel unit cell in the Digital-to-RF-converter, according to the present invention.

Each of the parallel unit cells 20 is a Gilbert-cell type converter. It comprises a differential data switch section, connected in series with a differential LO-switch pair and a current source, as shown in FIG. 5. The differential data switch section has two differential switch pairs (Q1, Q2) and (Q3, Q4). Each differential data switch pair has two current control paths, $I_N$ and $I_{xN}$, connected to the output terminals $V_o$ and $V_{xo}$. The currents in these paths are controlled by complementary signals $V_{LN+}$ and $V_{LN-}$, which are provided by a digital control logic (not shown) and are indicative of the value of signal N. As shown in FIG. 5, the control voltage $V_{LN+}$ is used to control the currents in Q1 and Q4, and the control voltage $V_{LN-}$ is used to control the currents in Q2 and Q3. Accordingly, the current path Q1 is connected in parallel to the current path Q3. Likewise, the current path Q2 is connected in parallel to the current path Q4.

Each of the differential data switch pairs is connected in series to a differential LO switches Q5 or Q6 so that the differential signals LO+ and LO− from the local oscillator (LO in FIG. 4) can be used to modulate the current in the differential data switch pairs. The differential LO switch formed with Q5 and Q6 is connected in series to the current source Q7, so as to allow the currents generated in the cell 20 to be adjusted by DC bias7.

It should be noted that Q1 to Q7 depicted in FIG. 5 are MOS transistors, but any one of them can be replaced with other type of transistors.

Figure 6:
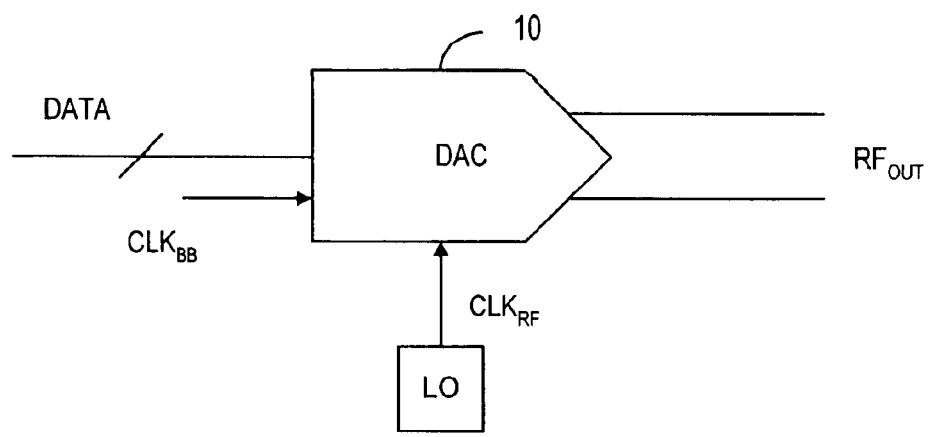
FIG. 6 is a function block diagram showing the input and output signals in relation with the Digital-to-RF-converter.

FIG. 6 is a functional block diagram of the D/A upconverter 10. In the figure, DATA is the data from the digital baseband, $CLK_{BB}$ is the sampling clock, and $CLK_{RF}$ is the signal from an LO.

Figure 7:
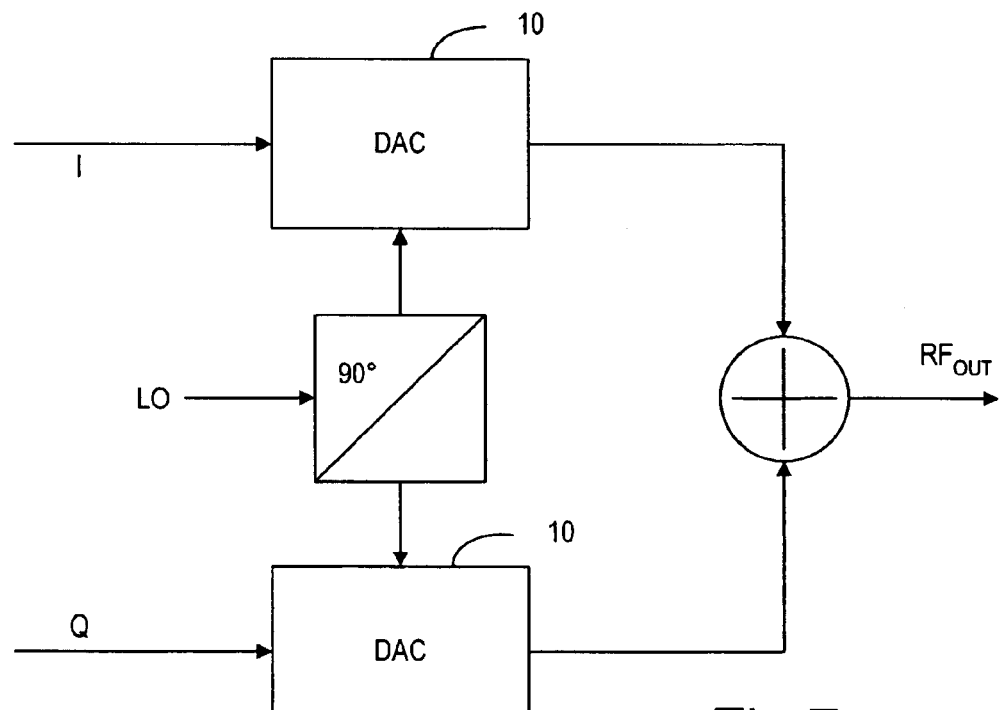
FIG. 7 is a block diagram showing a circuitry for suppressing mirror components in an upconverted signal.

It should be noted that, in direct digital-to-RF conversion, image components are generated by the D/A-conversion function to $f_{CLK,RF} \pm n*(f_{CLK,BB} \pm f_{signal})$, where $f_{CLK,RF}$ is the frequency of the LO signal, n is a positive integer, $f_{CLK,BB}$ is the sampling frequency and $f_{signal}$ is the frequency of the digital data. Furthermore, the SINC-function of the D/A-conversion generates a notch to $f_{CLK,RF} \pm n*f_{CLK,BB}$. If the narrow band digital data is generated to baseband (0 Hz), the image frequency of the D/A-conversion function falls to the notch of the SINC-function and the image components are significantly reduced. The image components of the upconversion function in the RF output signal can be suppressed by using an I/Q modulator architecture, as shown in FIG. 7. In this image rejection architecture, two D/A upconverters 10 are used to upconvert the digital data.

Although the invention has been described with respect to a preferred embodiment thereof, it will be understood by those skilled in the art that the foregoing and various other changes, omissions and deviations in the form and detail thereof may be made without departing from the scope of this invention.

What is claimed is:

1. A digital to RF-conversion device for converting a digital signal having a plurality of data bits for providing a differential output signal modulated by a carrier signal, the carrier signal provided between two carrier signal ends, wherein the differential output signal is formed with current loads and provided between two output ends, said device comprising:
   a plurality of conversion units connected in parallel, each unit adapted to receive a control voltage indicative of a data signal value, the control voltage provided between two control voltage ends, each unit comprising:
   a first differential switch section having:
      two input current paths, each operatively connected to a different one of the output ends; and
      two differential switch pairs connected to the control voltage ends for conveying in the two input current paths differential currents indicative of the data signal value;
   a second differential switch section having two control current paths, each operatively connected in series to a different one of the two differential switch pairs, the control current paths operatively and separately connected to different ones of the carrier signal ends, for modulating the differential currents with the carrier signal; and
   a current source, operatively connected in series to the second differential switch section for further controlling currents in the control current paths.

2. The device of claim 1, wherein the current source comprises at least one current adjusting component having a control terminal, operatively connected to a bias voltage level, for adjusting the current passing through the current adjusting component.

3. The device of claim 1, wherein the second differential switch section comprises two current switching components disposed in different ones of the control current paths, each of the current switching components having a control terminal operatively connected to a different one of the carrier signal ends.

4. The device of claim 1, wherein the first differential switch section comprises a first pair of differential switches and a second pair of differential switches, each pair having two current switches operatively connected to different ones of the control voltage ends.

5. A method for direct digital to RF-conversion for converting a digital signal having a plurality of data bits for providing a differential output signal modulated by a carrier signal, the carrier signal provided between two carrier signal ends, wherein the differential output signal is formed with current loads and provided between two output ends, said method comprising the steps of:
   1) providing a plurality of conversion units connected in a parallel, each unit adapted to receive a control voltage indicative of a data signal value, the control voltage provided between two control voltage ends, each unit comprising:
   a first differential switch section having:
      two input current paths, each operatively connected to a different one of the output ends; and
      two differential switch pairs connected to the control voltage ends for conveying in the two input current paths differential currents indicative of the data signal value; and
   a second differential switch section having two control current paths, each of which operatively connected in series to a different one of the two differential switch pairs;
   2) operatively and separately connecting the control current paths to different ones of the carrier signal ends, for modulating the differential currents with the carrier signal; and
   3) operatively connecting a current source in series to the second differential switch section for further controlling currents in the control current paths.

* * * * *